US012716946B2

(12) United States Patent
Seiler et al.

(10) Patent No.: US 12,716,946 B2
(45) Date of Patent: Aug. 25, 2026

(54) TESTING A CONTROL DEVICE USING A TEST ASSEMBLY

(71) Applicant: dSPACE GmbH, Paderborn (DE)

(72) Inventors: Remigiusz Seiler, Paderborn (DE); Irina Baum, Paderborn (DE)

(73) Assignee: dSPACE SE & Co. KG, Paderborn (DE)

( * ) Notice: Subject to any disclaimer, the term of this patent is extended or adjusted under 35 U.S.C. 154(b) by 147 days.

(21) Appl. No.: 18/619,303

(22) Filed: Mar. 28, 2024

(65) Prior Publication Data

US 2024/0337695 A1 Oct. 10, 2024

(30) Foreign Application Priority Data

Apr. 5, 2023 (DE) ..................... 10 2023 108 737.1

(51) Int. Cl.
*G01R 31/319* (2006.01)
*G01R 31/3193* (2006.01)

(52) U.S. Cl.
CPC . *G01R 31/31905* (2013.01); *G01R 31/31928* (2013.01); *G01R 31/31937* (2013.01)

(58) Field of Classification Search
None
See application file for complete search history.

(56) References Cited

U.S. PATENT DOCUMENTS

2004/0181731 A1* 9/2004 Rajsuman ............. G06F 11/263 714/747
2018/0196103 A1* 7/2018 Champoux ...... G01R 31/31908
2021/0373545 A1 12/2021 Mueller
2025/0271547 A1* 8/2025 Lange ....................... G01S 7/40

FOREIGN PATENT DOCUMENTS

CN 101115011 A 1/2008
CN 115269622 A 11/2022
WO WO 2020/165067 A1 8/2020
WO WO 2023052416 A1 4/2023

* cited by examiner

*Primary Examiner* — Jermele M Hollington
(74) *Attorney, Agent, or Firm* — LEYDIG, VOIT & MAYER, LTD.

(57) ABSTRACT

A test assembly for testing a control device using a message includes: a receiver configured for receiving the message in fragments, wherein each fragment has a first identifier, which denotes a chronological order of the respective fragment in the message, and a second identifier; a buffer memory configured for storing the fragments on the basis of the first and second identifiers, wherein the second identifier causes all the fragments of the message to be recorded in the buffer memory in time to allow the message to be manipulated before the first fragment of the message is to be sent to the control device; a manipulator configured for modifying the message on the basis of predetermined data; and a transmitter configured for sending the modified message to the control device.

15 Claims, 4 Drawing Sheets

| Message | Z1 |
|---|---|
| TP1 | 1 |
| TP2 | 2 |
| TP3 | 3 |
| SOME/IP Event | 3.5 |
| TP4 | 4 |
| TP5 | 5 |

Fig. 4

| Message | Z1 |
|---|---|
| TP1 | 1 |
| TP2 | 2 |
| TP3 | 3 |
| TP4 | 4 |
| TP5 | 5 |
| SOME/IP Event | 3.5 |

Fig. 5

| Message | Z1 | Z2 |
|---|---|---|
| TP1 | 1 | 1 |
| TP2 | 2 | 1 |
| TP3 | 3 | 1 |
| TP4 | 4 | 1 |
| TP5 | 5 | 1 |
| SOME/IP Event | 3.5 | 3.5 |

Fig. 6

| Message | Z1 |
|---|---|
| TP1′ | 1 |
| TP2′ | 1.5 |
| TP3′ | 2 |
| TP4′ | 2.5 |
| TP5′ | 3 |
| TP6′ | 3.5 |
| SOME/IP Event | 3.5 |
| TP7′ | 4 |
| TP8′ | 4.5 |
| TP9′ | 5 |

Fig. 7

TESTING A CONTROL DEVICE USING A TEST ASSEMBLY

CROSS-REFERENCE TO PRIOR APPLICATIONS

This application claims benefit to German Patent Application No. DE 102023108737.1, filed on Apr. 5, 2023, which is hereby incorporated by reference herein.

TECHNICAL FIELD

The application relates to a test assembly for testing a control device via at least one message, and to an apparatus and to a method for testing a control device using a test assembly and using at least one message.

BACKGROUND

WO 2020/165067 discloses a reproduction unit for storing and playing back recorded messages. By way of example, the reproduction unit can be a device for recording and playing back messages in a vehicle network, as marketed, for example, as the product AUTERA by dSPACE GmbH. A reproduction unit can, however, also be integrated in a simulator.

SUMMARY

In an exemplary embodiment, the present invention provides a test assembly for testing a control device using a message. The test assembly includes: a receiver configured for receiving the message in fragments, wherein each fragment has a first identifier, which denotes a chronological order of the respective fragment in the message, and a second identifier; a buffer memory configured for storing the fragments on the basis of the first and second identifiers, wherein the second identifier causes all the fragments of the message to be recorded in the buffer memory in time to allow the message to be manipulated before the first fragment of the message is to be sent to the control device; a manipulator configured for modifying the message on the basis of predetermined data; and a transmitter configured for sending the modified message to the control device in such a way that fragments of the modified message are sent on the basis of the first identifier such that a first fragment of the modified message is sent at the start of a transmission time and a last fragment of the modified message is sent at the end of the transmission time, while the other fragments of the modified message are evenly spread out over the transmission time.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 4 shows a first table;

FIG. 5 shows a second table;

FIG. 6 shows a third table; and

FIG. 7 shows a fourth table.

DETAILED DESCRIPTION

Figure 1:
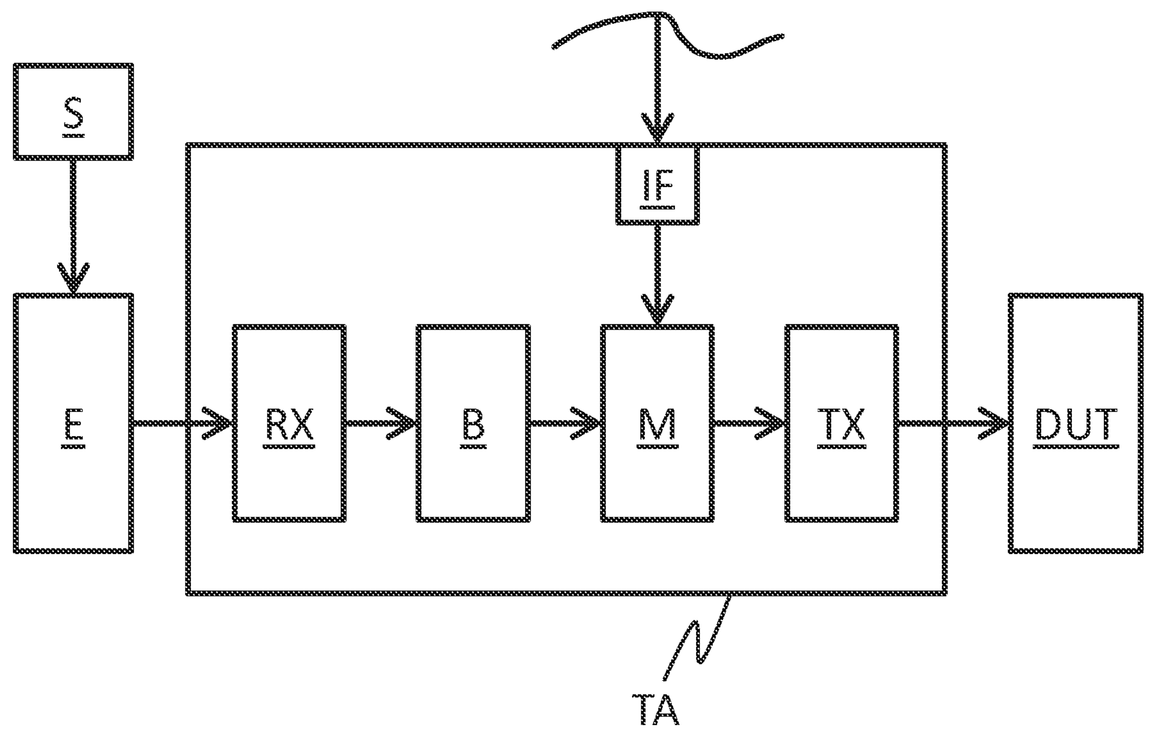
FIG. 1 is a first block diagram of an embodiment example of a test assembly comprising connected components.

A test assembly for testing a control device using at least one message comprises:

- a receiver configured for receiving the message in fragments, each fragment having a first identifier, which denotes a chronological order of that particular fragment in the message, and a second identifier,
- a buffer memory configured for storing the fragments on the basis of the first and second identifiers,
- the second identifier causing all the fragments of the message to be recorded in the buffer memory simultaneously as far as possible,
- a manipulator configured for modifying the message on the basis of predetermined data,
- a transmitter configured for sending the modified message having at least one fragment to the control device in such a way that the fragments of the modified message are sent on the basis of the first identifier such that a first fragment of the modified message is sent at the start of a transmission time and a last fragment of the modified message is sent at the end of the transmission time, while the other fragments of the modified message are spread out over the transmission time, in particular are evenly spread out.

Furthermore, an apparatus is provided which is configured for sending the at least one message in fragments to the receiver of the test assembly, the apparatus being connected to a memory in which the at least one message is stored.

Furthermore, a method for testing a control device via a test assembly and via at least one message is provided. The method comprises:

- receiving the message in fragments, each fragment having a first identifier, which denotes a chronological order of that particular fragment in the message, and a second identifier,
- storing the fragments in a buffer memory on the basis of the first and second identifiers, the second identifier causing all the fragments of the message to be recorded in the buffer memory simultaneously as far as possible,
- modifying the message on the basis of predetermined data,
- sending the modified message having at least one fragment to the control device in such a way that the fragments of the modified message are sent on the basis of the first identifier such that a first fragment of the modified message is sent at the start of a transmission time and a last fragment of the modified message is sent at the end of the transmission time, while the other fragments of the modified message are spread out over the transmission time, in particular are evenly spread out.

An advantage of the test assembly for testing the control device using the at least one message, and of the apparatus and the method for testing the control device using the test assembly is that, in the case of fragmented messages, the test assembly can perform manipulations using the manipulator without compromising the timely playback of further messages. This is achieved in particular in that the fragments of the message have a second identifier, which causes all the fragments of the message to be recorded in the buffer memory simultaneously as far as possible. Here, "simultaneously" means that as soon as the first fragment is recorded, all the other fragments of the message that arrive from the apparatus are also recorded in the buffer memory. At least, however, the last fragment of the message should have been recorded in the buffer memory early enough that the message can be manipulated before the first fragment of the message is to be sent to the control device to be tested. In the process, the timely reproduction of messages is also ensured if the manipulator modifies the message on the basis of predetermined data in such a way that additional fragments are added or fragments are removed, for example.

The first and second identifiers can be prefixed to the message, or to the fragments of the message, for example as headers, or can be appended in another way. Shortly before the sending to the control device to be tested, these identifiers are removed again so that the message sent to the control device, or the fragments thereof, complies with the communication protocol expected by the control device.

The test assembly is a device for testing a control device and, for this purpose, comprises the above-described components: receiver, buffer memory, manipulator, and transmitter. The test assembly can also be referred to as a simulator. Using such a test assembly, so-called hardware-in-the-loop (HIL) or software-in-the-loop (SIL) tests can be implemented. As a result, the control device can be confronted with a huge range of different situations by a test assembly of this kind. The response of the control device can thus be tested; in particular, it can be checked that the control device functions as intended in these situations. It is thus possible, for example, to reduce or even eliminate costs resulting from test journeys of, for example, a vehicle in which the control device is located. The individual units simulated by the test assembly are modeled by one or more computers by software modules or dedicated hardware arrangements. The units can be other control devices, sensors, or power electronics, for example. For the control device, therefore, it is possible to simulate an environment that also surrounds it in the installed state, e.g., during normal operation.

The message sent by the apparatus and received by the test assembly may have been recorded in particular during test journeys, for example. The message itself can also have an identification (ID) to be assigned to the message. However, such IDs can be ambiguous or may not even be present, at least on a particular processing level. The first and second identifiers are therefore allotted by the apparatus in addition to a potentially pre-existing identification and can have the same content for different messages. The first and second identifiers can also be independent of the ID.

The apparatus preferably sends the messages via a data stream. This data stream can be stopped by the test assembly when the buffer memory is full, and can continue to be received only when the buffer memory has free capacity again. The second identifier influences the time of the recording in the buffer memory. The first identifier provides information on the time at which the message is to be sent.

The control device is a piece of electrical equipment that receives incoming signals, for example sensor signals and/or signals from other control devices, and/or input signals, and generates a control signal on the basis thereof. The control signal is then used, for example, to actuate a further control device or, for example, an actuator of, for example, a brake, an airbag, or even an automated traction apparatus. The control device therefore has input and output interfaces.

The modified message having the modified fragments is sent to the control device via an input interface of this kind and is fed to said control device in order to check how the control device reacts to that message. For this purpose, the test assembly has a receiver that is configured for receiving the message in fragments. The receiver of the test assembly can evaluate the fragments and assign them to the message.

By way of example, the message can be sent by the apparatus, which can have a further computer, and transmitted to the test assembly. However, the message can also already exist within the test assembly, or the apparatus can be provided in the test assembly, and thus be transmitted to the receiver in the test assembly. As set out above, the message includes, for example, sensor information or control signals from other control devices or other input signals.

In the present case, the message is in fragments, i.e., in parts, which together form the message. The message is transmitted to the receiver in these fragments. These fragments are necessary since, for example, the predetermined packet size of the data transmission used for the message is smaller than the size of the message. This makes it necessary for the message to be split into such parts, i.e., into the fragments. In particular, it can be provided that the size of the fragments received by the test assembly is the same as the size of the fragments sent by the test assembly. However, a message can also be the same size as or smaller than such a data packet size inasmuch as there is only one fragment that is the same size as such a data packet. This should also be construed as a fragment even if there is then only one.

Each fragment has a first identifier, which denotes a chronological order of that particular fragment in the message. This can be in the form of a first timestamp, for example. The first timestamp indicates when that particular fragment should be sent. The first timestamp can be a timestamp of the recording of the message fragment during a test journey and can thus indicate when the message should be played back relative to the other recorded messages during a reproduction for test purposes. Adhering to the time rules as stipulated can be advantageous, for example, in order to successfully pass potential plausibility checks of the control device.

In the present case, a second identifier is also used, the second identifier causing all the fragments of the message to be recorded in the buffer memory simultaneously as far as possible. The second identifier can be in the form of a second timestamp. Thus, the fragments belonging to the message can then be input into the buffer memory almost at the same time, despite them having a different first timestamp. In particular, owing to the second identifier the last fragment can be input before the first fragment is sent. In particular, a time buffer, which may be 5 ms, for example, can be provided for the manipulation.

The manipulator is configured for modifying the message on the basis of predetermined data. In this case, the message can be reconstituted from the fragments and then the modification can be carried out on the entire message. The message is split into fragments again before being sent. This splitting can be done in the manipulator or in the transmitter of the test assembly. In this case, the number of fragments can vary by comparison with the number of received fragments. It is possible that some or all of the fragments are not modified, i.e., that the message passes through the manipulator and then some or all of the fragments re-sent by the transmitter are unmodified. In the present case, the fragments that pass through the manipulator are referred to as modified since they belong to a modified message, i.e., to a message that is modified since it has passed through the manipulator.

A manipulation of this kind can, for example, increase the number of fragments, leave the number the same, or reduce it. The manipulator is implemented by a processor, for example.

The transmitter is a transmission apparatus of the test assembly in order to send the modified message to the control device in fragments again such that modified fragments are sent in accordance with the first identifier. In this case, "sent in accordance with the first identifier" means that they are sent in such an order that a first modified fragment is sent at the start of a transmission time and a last modified fragment is sent at the end of the transmission time if the other modified fragments are spread out over the transmission time, in particular are evenly spread out. The transmitter can, for example, be a suitable logic circuit or processor having a corresponding program and a bus controller or a transmission apparatus for a point-to-point interface. Wireless transmission is also possible. Therefore, the message is fragmented again by means of the transmitter (unless this has already been done by the manipulator) and the fragments are sorted according to the first identifier before sending. For this purpose, the transmitter can have a transmission buffer in which the message is sorted in accordance with the first identifier and thus supplied in order to be sent.

By way of example, the apparatus configured for sending the at least one message in the fragments to the receiver of the test apparatus can be a computer that is formed outside the test assembly and, in the process, connected to a memory in which the at least one message is stored. Any kind of electronic memory is possible as a memory. Alternatively, it is possible that the apparatus is part of the test assembly and thus transmits the message to the receiver in the test assembly. In that case, the memory can also be part of the test assembly.

The same applies to the method for testing the control device using the test assembly and the at least one message.

In an embodiment of the test assembly, the receiver is additionally configured for receiving a further message, the further message likewise having respective first and second identifiers. In this case, the buffer memory is configured for storing the further message on the basis of the first and second identifiers of the further message. Furthermore, the transmitter is configured for transmitting the further message to the control device on the basis of the respective first identifier of the further message.

In an embodiment of the test assembly, the manipulator is configured for modifying the number of fragments on the basis of the data. In an embodiment of the method, the number of fragments is modified by the manipulator on the basis of the data. This is done, for example, by manipulating the message on the basis of the data, the result of which is then a modification to the number of fragments of the message.

Furthermore, it can be provided that the start of the transmission time is dependent on the first identifier of the first fragment, and the end of the transmission time is dependent on the first identifier of the last fragment.

In an embodiment, the test assembly has an interface, the manipulator being connected to the interface and being configured for receiving the data supplied by the interface. By way of example, a user intervention can then be carried out via the interface in order to supply the manipulator with data so that particular states can be generated by the manipulator. Thus, the message can be modified in such a way as to, for example, simulate a particular situation, in particular a particular driving situation.

In an embodiment, it is provided that the receiver is configured for receiving the at least one message in the fragments from an apparatus. Accordingly, the receiver is set up for such a transmission format in order to be able to correctly receive and process the received data. The transmission format may be Ethernet. In this case, the apparatus is configured in particular for equipping the fragments of the message with the second identifier. In particular, the apparatus can access the message that is stored in a memory, said message already being stored in the memory in fragments having the first identifier. The apparatus can then add the second identifier to the fragments of the message having the first identifier, which second identifier can comprise the first identifier of the first fragment, for example. The message stored in the memory in fragments having the first identifier can, for example, originate from a recording of one or more test journeys.

In an embodiment, the apparatus is in the form of software configured for accessing the memory and reading out the message stored in the memory. Optionally, the test assembly can comprise the apparatus and/or the memory. In this case, the fragments of the message can already be stored in the memory. The stored fragments of the message can, for example, originate from a recording of, for example, a test journey or a simulated test journey. Furthermore, the apparatus can be configured for equipping the fragments with the second identifier.

By sending the modified message to the control device in fragments, a simulation of being on a test journey can be produced for the control device. In this way, the functioning of the control device can be tested, for example. The message fragments sent by the test assembly thus obey the same rules in terms of the transmission format, for example a communication protocol, as the message fragments received by the apparatus. The transmission format may be Ethernet.

Optionally, the apparatus can have a fragmenter configured for splitting the at least one message into fragments on the basis of a data size of the at least one message and for equipping it with the first and second identifiers. In this case, it is also possible that the message is the same size as or smaller than the intended data size of a fragment, so only one fragment may then be present.

As explained, the first or the second identifier can have a respective timestamp or be specified by such a timestamp.

Furthermore, it is provided that the second identifier has the first timestamp of the first fragment of the at least one message. Thus, the same date, e.g., the same data content as used for the first fragment in the first timestamp, can then also be used for the second identifier for all the fragments.

Embodiment examples are shown in the drawings and are explained in more detail in the following description.

FIG. 1 is a block diagram of an embodiment example of a test assembly TA comprising connected components, namely an apparatus E, which is connected to a memory S, and a control device DUT. Furthermore, data are received from the exterior via an interface IF; where applicable, a manipulator M modifies or manipulates a message on the basis of said data.

A receiver RX of the test assemblies TA receives fragments TP1-TP5 of the message, which are transmitted to the receiver RX by the apparatus E. In addition to the fragments TP1-TP5 of the message, a further message SOME/IP Event is also transmitted. Once the fragments TP1-TP5 and the further message SOME/IP Event have been received, said data are saved in a buffer memory B. For this purpose, a first identifier Z1 and a second identifier Z2 are used. In the manipulator M, said message data stored in the buffer memory B are then modified on the basis of the data received via the interface IF; for example, additional fragments are generated. It is possible that the data indicate that no actual modification needs to be performed on the fragments. The fragments TP1'-TP9' of the message modified by the manipulation also have the first and second identifiers Z1, Z2.

In particular, the message can be modified such that the message content of the message reconstructed from the fragments is modified. A modified length of the modified message can then result from the modified message content, and the modified message is then split into the modified fragments.

In an alternative embodiment, a modification is performed by the manipulator directly on a fragment.

In that case, the fragments TP1'-TP9' of the modified message are sent to the control device DUT via the transmitter TX. In the process, the transmission time is defined by the first and the last fragment TP1', TP9', and the other fragments TP2'-TP8' of the message are spread out over the transmission time, for example are evenly spread out. The further message SOME/IP Event is sent precisely at its time point given by the first identifier Z1, in order to allow the test recording to be reproduced as realistically as possible.

Figure 2:
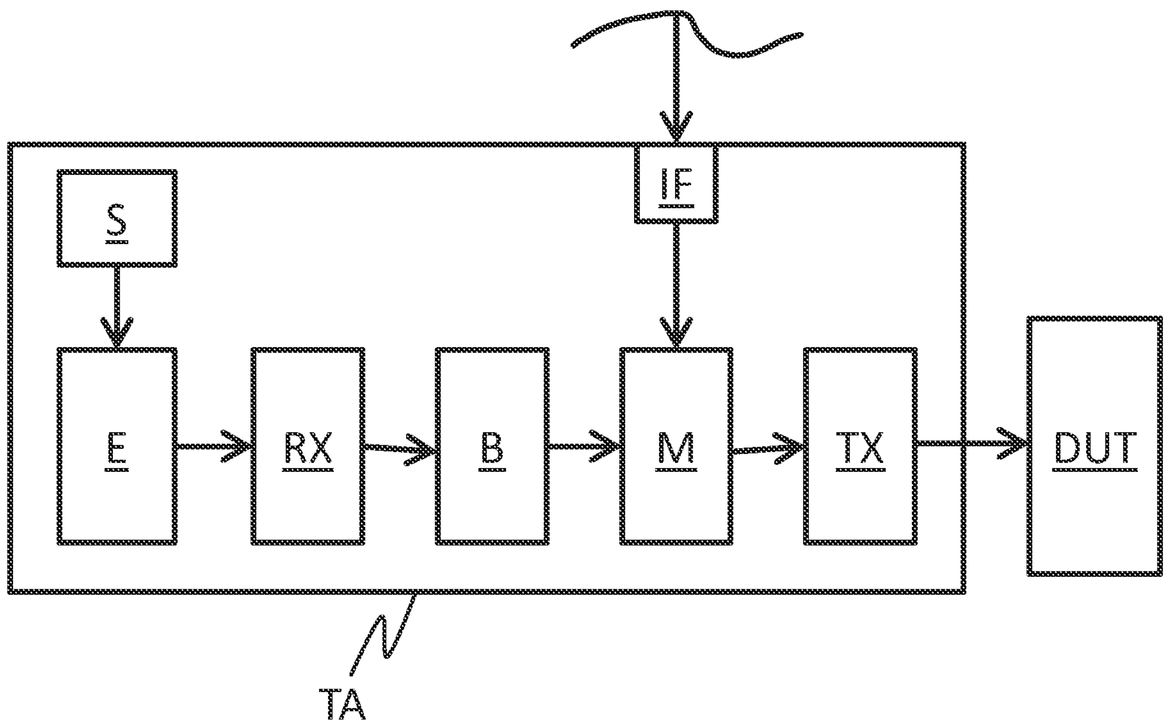
FIG. 2 is a second block diagram of a further embodiment example of a test assembly comprising connected components.

FIG. 2 is a second block diagram of the test assembly TA according to the invention, in which the apparatus E and the memory S are part of the test assembly TA. The other components are given the same reference signs and fulfill the same tasks as in FIG. 1. The components shown can all be in the form of respective software modules, for which purpose the test assembly TA then has one or more computers in order for said software modules to be executed.

Figure 3:
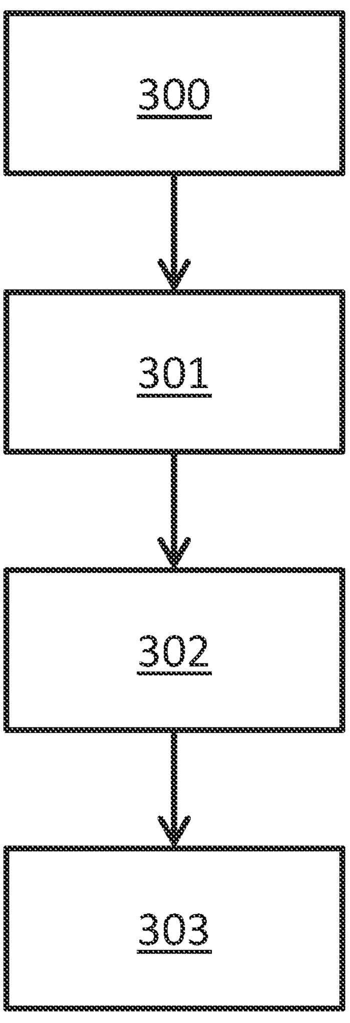
FIG. 3 is a flowchart of a method.

FIG. 3 is a flowchart of a method according to this application. In method step 300, the fragments TP1-TP5 of the message are received by the receiver RX. In method step 301, they are then saved in the buffer B in accordance with the second identifier Z2, the fragments TP1-TP5 being saved in the buffer B almost simultaneously owing to the second identifier. In method step 302, the compiled message is manipulated by the manipulator M on the basis of data fed in via the interface IF. In method step 303, the modified and newly fragmented message is then sent in a manner sorted on the basis of the first and second identifiers Z1, Z2, the further message SOME/IP Event being sent at the same point at which it was also received, i.e., in accordance with the first identifier Z1. The first fragment TP1' of the modified message and the last fragment TP9' of the modified message are sent in accordance with their first identifier Z1, and the other fragments TP2'-TP8' of the modified message are spread out therebetween across the rest of the transmission time. In this case, it is possible in particular for them to be evenly spread out.

FIG. 4 shows an example message in a table. Here, the five fragments of this message are denoted by TP1 to TP5 in the first column. Their chronological order is designated by the first timestamp Z1. TP1 is thus the first fragment that is received and sent, and TP5 is the last. In addition, the further message SOME/IP Event is listed here. In the present case, this further message has the timestamp Z1 of 3.5, which is between the fragments TP3 and TP4.

In FIG. 5, the fragments TP1 to TP5 are input successively, and the further message SOME/IP Event is appended to the end. This has been made possible by the second identifier Z2, for example in the form of a second timestamp. The fragments TP4 and TP5 can thus be evaluated before the further message SOME/IP Event. On the basis of the first timestamp Z1, however, evaluating TP4 and TP5 before the further message SOME/IP Event would not be possible because all the fragments TP1 to TP5 need to be present in order for the message to be manipulated. Therefore, the second identifier Z2 has been introduced according to this application, as can be seen in FIG. 6. Now, TP1 to TP5 have the value 1 as Z2, indicating that these fragments TP1 to TP5 are to be received at the receiver RX as far as possible at the same time Z1. They are thus recognized as being linked and are evaluated before the further message SOME/IP Event. The SOME/IP Event as the further message also has 3.5 as the second timestamp, and so the further message is easy to distinguish from the fragments.

FIG. 7 then shows a modified number of fragments TP1'-TP9', in which the number of fragments TP1'-TP9' for the modified message to be sent has risen to nine owing to the manipulation of the message by the manipulator M. It is important that, in the present case, the first and the last fragment TP1' and TP9' adhere to the original transmission time so that the overall transmission time is not altered. The further message SOME/IP Event is sent at the same original time.

In summary, the method can be described such that the second identifier Z2 is used for receiving the message and for making it available in the buffer B, and the first identifier is used—after the manipulation—for sending the message to the control device DUT.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "of" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

S Memory
E Apparatus
RX Receiver
TX Transmitter
B Buffer memory
TA Test assembly
M Manipulator DUT Control device
IF Interface
SOME/IP Event Further message
Z1 First timestamp
Z2 Second timestamp
TP1-TP5 Fragments
TP1'-TP9' Modified fragments
300-303 Method steps

The invention claimed is:

1. A test assembly for testing a control device using a message, comprising:

a receiver configured for receiving the message in fragments, wherein each fragment has a first identifier, which denotes a chronological order of the respective fragment in the message, and a second identifier;

a buffer memory connected to the receiver, wherein the buffer memory is configured for storing the fragments received by the receiver on the basis of the first and second identifiers, wherein the second identifier causes all the fragments of the message to be recorded in the buffer memory in time to allow the message to be manipulated before a first fragment of the message is to be sent to the control device;

a manipulator connected to the buffer memory, wherein the manipulator is configured for modifying the message received by the receiver on the basis of predetermined data; and a transmitter connected to the manipulator, wherein the transmitter is configured for sending the message modified by the manipulator to the control device in such a way that fragments of the modified message are sent on the basis of respective first identifiers such that a first fragment of the modified message is sent at the start of a transmission time and a last fragment of the modified message is sent at the end of the transmission time, while the other fragments of the modified message are evenly spread out over the transmission time.

2. The test assembly according to claim 1, wherein the receiver is further configured for receiving a further message, wherein the further message has respective first and second identifiers, wherein the buffer memory is configured for storing the further message on the basis of its respective first and second identifiers, and wherein the transmitter is configured for sending the further message to the control device on the basis of a respective first identifier of the further message.

3. The test assembly according to claim 1, wherein the manipulator is configured for modifying the fragments of the message.

4. The test assembly according to claim 1, wherein the start of the transmission time is dependent on the first identifier of the first fragment of the message, and the end of the transmission time is dependent on the first identifier of the last fragment of the message.

5. The test assembly according to claim 1, further comprising an interface, wherein the manipulator is connected to the interface and is configured for receiving data supplied by the interface.

6. The test assembly according to claim 1, wherein the receiver is configured for receiving the message in fragments from an apparatus.

7. The test assembly according to claim 1, wherein the test assembly further comprises a memory; and wherein the receiver is configured for receiving the message in fragments from the memory.

8. The test assembly according to claim 6, wherein the apparatus is configured for equipping the fragments of the message with the second identifier.

9. A system, comprising:

a test assembly for testing a control device using a message, the test assembly comprising:

a receiver configured for receiving the message in fragments, wherein each fragment has a first identifier, which denotes a chronological order of the respective fragment in the message, and a second identifier;

a buffer memory connected to the receiver, wherein the buffer memory is configured for storing the fragments received by the receiver on the basis of the first and second identifiers, wherein the second identifier causes all the fragments of the message to be recorded in the buffer memory in time to allow the message to be manipulated before a first fragment of the message is to be sent to the control device;

a manipulator connected to the buffer memory, wherein the manipulator is configured for modifying the message received by the receiver on the basis of predetermined data; and a transmitter connected to the manipulator, wherein the transmitter is configured for sending the message modified by the manipulator to the control device in such a way that fragments of the modified message are sent on the basis of respective first identifiers such that a first fragment of the modified message is sent at the start of a transmission time and a last fragment of the modified message is sent at the end of the transmission time, while the other fragments of the modified message are evenly spread out over the transmission time; and an apparatus configured for sending the message in the fragments to the receiver of the test assembly.

10. The system according to claim 9, wherein the apparatus is configured for equipping the fragments of the message with the second identifier.

11. A method for testing a control device using a test assembly and using a message, comprising:

receiving, by the test assembly, the message in fragments, wherein each fragment has a first identifier, which denotes a chronological order of the respective fragment of the message, and a second identifier;

storing, by the test assembly, the fragments in a buffer memory on the basis of the first and second identifiers, wherein the second identifier causes all the fragments to be recorded in the buffer memory in time to allow the message to be manipulated before a first fragment of the message is to be sent to the control device;

modifying, by the test assembly, the message on the basis of predetermined data; and sending, by the test assembly, the modified message to the control device in such a way that fragments of the modified message are sent on the basis of respective first identifiers such that a first fragment of the modified message is sent at the start of a transmission time and a last fragment of the modified message is sent at the end of the transmission time, while the other fragments of the modified message are evenly spread out over the transmission time.

12. The method according to claim 11, further comprising:

receiving a further message with respect to the message, wherein the further message has respective first and second identifiers, wherein the buffer memory stores the further message on the basis of its respective first and second identifiers, and wherein the test assembly sends the further message to the control device on the basis of a respective first identifier of the further message.

13. The method according to claim 11, wherein the test assembly modifies the fragments of the message.

14. The method according to claim 11, wherein a respective timestamp is used as the first and second identifiers.

15. The method according to claim 14, wherein the second identifier has a first timestamp of the first fragment of the message.

* * * * *